US008797830B2

(12) United States Patent
Baliga et al.

(10) Patent No.: US 8,797,830 B2
(45) Date of Patent: Aug. 5, 2014

(54) EXPLOSION-PROOF ACOUSTIC SOURCE FOR HAZARDOUS LOCATIONS

(75) Inventors: Shankar B. Baliga, Irvine, CA (US); John G. Romero, Rancho Santa Margarita, CA (US); Scott W. Reed, Rancho Santa Margarita, CA (US); Cristian S. Filimon, Orange, CA (US)

(73) Assignee: General Monitors, Inc., Lake Forest, CA (US)

( * ) Notice: Subject to any disclaimer, the term of this patent is extended or adjusted under 35 U.S.C. 154(b) by 192 days.

(21) Appl. No.: 13/019,547

(22) Filed: Feb. 2, 2011

(65) Prior Publication Data

US 2012/0194973 A1 Aug. 2, 2012

(51) Int. Cl.

| | |
|---|---|
| ***H05K 5/00*** | (2006.01) |
| ***H05K 7/00*** | (2006.01) |
| ***H01L 41/00*** | (2013.01) |
| ***H02N 2/00*** | (2006.01) |
| ***B06B 1/06*** | (2006.01) |
| ***G10K 11/00*** | (2006.01) |
| ***H04R 17/00*** | (2006.01) |
| ***G01V 1/18*** | (2006.01) |
| ***G01V 1/04*** | (2006.01) |
| ***G01F 25/00*** | (2006.01) |
| ***G01P 21/00*** | (2006.01) |
| ***G01H 3/00*** | (2006.01) |

(52) U.S. Cl.
USPC ...... 367/188; 361/679.01; 310/333; 367/140; 367/141; 367/155; 367/158; 367/178; 367/180; 367/190; 73/1.17; 73/592

(58) Field of Classification Search
USPC .............. 361/679.01, 158; 310/333; 367/158, 367/140, 141, 155, 178, 180, 188, 190; 73/1.17, 592
See application file for complete search history.

(56) References Cited

U.S. PATENT DOCUMENTS

| | | | | |
|---|---|---|---|---|
| 4,287,581 A * | 9/1981 | Neale, Sr. | ..................... | 367/135 |
| 4,333,028 A * | 6/1982 | Panton | .......................... | 310/326 |
| 4,704,709 A * | 11/1987 | Slebzak et al. | ................ | 367/158 |

(Continued)

FOREIGN PATENT DOCUMENTS

EP 1522839 4/2005

OTHER PUBLICATIONS

Approval Standard for Electric Equipment for use in Hazardous (Classified) Locations General Requirements, Nov. 1998, FM Global Technologies, Nov. 1998.

(Continued)

*Primary Examiner* — Anthony Haughton
*Assistant Examiner* — Zhengfu Feng
(74) *Attorney, Agent, or Firm* — Larry K. Roberts

(57) ABSTRACT

An explosion-proof system for generating acoustic energy. An exemplary embodiment of the system includes a main housing defining an open housing space and an opening. A cover structure is configured for removable attachment to the main housing structure to cover the opening and provide an explosion-proof housing structure. The cover structure includes an integral head mass. An acoustic energy emitting assembly includes the head mass, and an excitation assembly disposed within the explosion-proof housing structure. An electronic circuit is disposed within the explosion-proof housing structure to generate a drive signal for driving the excitation assembly to cause the acoustic energy emitting assembly to resonate and generate acoustic energy. In one embodiment the acoustic energy is a beam of ultrasonic energy useful for testing ultrasonic gas detectors. A method is also described for testing ultrasonic gas leak detectors using an ultrasonic source.

27 Claims, 7 Drawing Sheets

(56) References Cited

U.S. PATENT DOCUMENTS

| | | | | |
|---|---|---|---|---|
| 5,401,174 | A * | 3/1995 | Hansen | 439/34 |
| 5,452,267 | A * | 9/1995 | Spevak | 367/163 |
| 5,561,290 | A * | 10/1996 | Strobel et al. | 250/252.1 |
| 5,610,876 | A * | 3/1997 | Jeffers | 367/139 |
| 5,726,952 | A * | 3/1998 | Eckert et al. | 367/140 |
| 6,617,848 | B2 * | 9/2003 | Abe | 324/210 |
| 6,647,762 | B1 | 11/2003 | Roy | |
| 7,081,699 | B2 * | 7/2006 | Keolian et al. | 310/311 |
| 7,126,878 | B1 | 10/2006 | Erikson | |
| 7,227,294 | B2 * | 6/2007 | Mazz et al. | 310/317 |
| 7,318,335 | B2 * | 1/2008 | Olesen et al. | 73/1.02 |
| 2009/0060246 | A1 * | 3/2009 | Baliga et al. | 381/354 |

OTHER PUBLICATIONS

Approval Standard for Explosionproof Electrical Equipment General Requirements, Aug. 2006, FM Approvals.

C22.2 No. 30-M1986; Explosion-Proof Enclosures for Use in Hazardous Locations; Industrial Products; Forming Part of Canadian Electrical Code, Part II; Safety Standards for Electrical Equipment; Nov. 1986; Canadian Standards Association; Rexdale (Toronto), Ontario Canada.

The International Standard, Electrical Apparatus for Explosive Gas Atmospheres, Part 1, Flameproof Enclosures "d", IEC-60079-1 (Fifth Ed. Nov. 2003), excerpt, Sections 5 and 11, 15 pages.

* cited by examiner

EXPLOSION-PROOF ACOUSTIC SOURCE FOR HAZARDOUS LOCATIONS

BACKGROUND OF THE DISCLOSURE

The utilization of ultrasonic gas leak detectors is increasing in industrial applications such as oil and gas and petrochemical industries for the detection of leaks of pressurized combustible and toxic gases. Rather than relying on the gas reaching the sensor element, ultrasonic gas leak detectors detect a leak through the ultrasound produced by the escaping gas, for mass flow rates ranging from a fraction of a gram per second for small leaks to over 0.1 kg/sec for larger leaks. The ultrasonic gas leak detector monitors the airborne sound pressure level (SPL), measured in decibels (dB), generated by the pressurized gas leak: the detection range scales with the sound pressure level (SPL) produced by the leaks.

One of the principal advantages of ultrasonic gas leak detectors is that leaks can be simulated, using inert, safe gases, providing a method for system verification that is uncommon among other type of gas sensors. Using an inert gas such as helium or nitrogen as a proxy, a technician can produce leaks at a controlled leak rate through an orifice of known size and shape without creating a hazardous situation. Such simulation is useful for determining adequate coverage for minor leaks that should be caught before the hazard escalates into a more severe incident.

While simulation using inert gases is an established practice for the setup and commissioning of ultrasonic gas leak detectors, there as yet, does not exist any means for testing system functionality of the installed gas detectors on a routine, inexpensive and convenient basis. The result is a capability gap in being able to provide a remote gas check or "bump test" to ensure system readiness and functional safety. It is very cumbersome and costly to carry bottles of pressurized inert gas around a plant environment comprising pipes, scaffolding and stairs. Logistic issues are also involved in the timely delivery of gas bottles and appropriate gas regulators, and in the transportation of the heavy gas bottles to the test sites.

DETAILED DESCRIPTION OF THE DISCLOSURE

Figure 1:
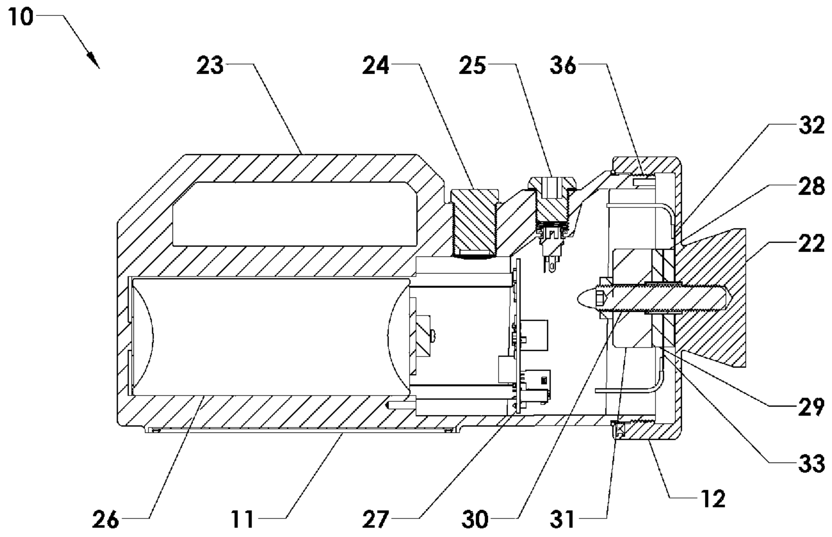
FIG. 1 illustrates a cross sectional view of an exemplary embodiment of an acoustic energy source system.

In the following detailed description and in the several figures of the drawing, like elements are identified with like reference numerals.

An exemplary application of the portable ultrasonic source described herein is for testing system functionality of installed ultrasonic gas leak detectors without the expense and inconvenience of carting heavy bottles of inert gas in an industrial environment.

In order to be transported and operated in industrial installations with explosive or potentially explosive atmospheres, an electrical device should meet an accepted method of protection. An accepted method of protection in North America for such devices is the "explosion proof method", known as XP, which ensures that any explosive condition is contained within the device enclosure, and does not ignite the surrounding environment. In Europe, the term "flameproof", known as EEx d, is used for an equivalent method and level of protection. In this description, the terms "explosion proof" and "flameproof" are used synonymously to avoid global variations in terminology. There are established standards for explosion proof or flameproof designs; systems can be certified to meet these standards. Some of the standards that are widely accepted by the industry and government regulatory bodies for explosion proof or flameproof design are CSA C22.2 No. 30-M1986 from the Canadian Standards Association, FM 3600 and FM3615 from Factory Mutual, and IEC 60079-0 and 60079-1 from the International Electrotechnical Commission. These standards are herein incorporated by reference.

Figure 2A:
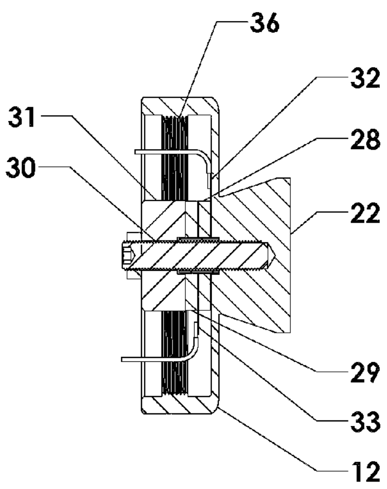
FIG. 2A illustrates an exemplary front cover of the system of FIG. 1 that includes an ultrasonic emitting transducer.
Figure 2B:
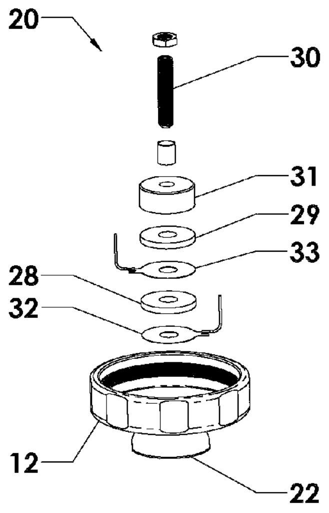
FIG. 2B shows an exploded view of an exemplary embodiment of an acoustic energy emitting transducer of the system of FIG. 1.

FIG. 1 illustrates a cross sectional view of an exemplary embodiment of an acoustic source system 10. The system includes a main housing 11 and a front cover 12. The two form an explosion proof enclosure. The acoustic energy generated by the source in this embodiment is emitted from the front face 22 of the front cover 12. The acoustic energy generated by an exemplary embodiment of the system 10 is in the range from a few kHz in the audible range to about 100 kHz in the ultrasonic range, suitable for use in a setup to test acoustic gas leak detectors. The acoustic source 10 in an exemplary embodiment is configured to generate ultrasonic energy, although the system has utility at other frequency ranges as well. The system 10 includes an acoustic transducer which, in an exemplary embodiment, includes an ultrasonic energy generating assembly generally referred by reference 20 in FIG. 2B and attached to the front cover 12 (FIG. 2A). FIG. 2B shows an exploded view of the ultrasonic generating transducer assembly 20.

Other features on the exterior of the system 10 include a carrying handle 23, a piezo touch switch 24, and a threaded plug 25 that can be unscrewed to attach the cable of a battery charger to a port revealed by removal of the plug 25. The piezo touch switch 24 may be of the illuminated type that provides the user status information via colored light emitting diodes (LEDs) on the touch surface, e.g., battery charging, battery fully charged, battery discharged, or system on and emitting ultrasonic energy.

Figure 3:
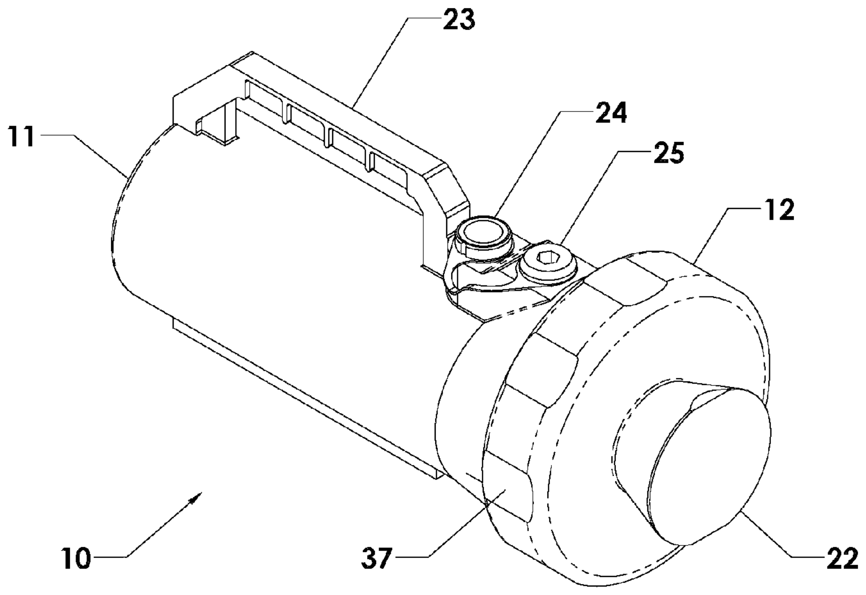
FIG. 3 illustrates an isometric view of the ultrasonic tester of FIG. 1.

FIG. 3 illustrates an isometric view of the system 10. The internal components of the system include a rechargeable battery pack 26 and an electronic drive circuit 27 to drive the ultrasonic emitting assembly 20.

In this exemplary embodiment, the ultrasonic generating front face 22 is a head or front mass of a composite piston or hammer type transducer known as the electroacoustic "Tonpilz" projector transducer. The generating assembly 20 contains two longitudinally poled piezoelectric ceramic lead zirconate titanate (PZT) rings 28 and 29 held together by a stress bolt 30 and sandwiched between the head mass and a more massive tail or rear mass 31 (See, e.g., FIGS. 2A and 2B). The tail mass 31, piezoelectric ceramic rings 28 and 29, and head mass 22 form a two mass resonator assembly. For typical emitter applications, the piezoelectric ceramic rings preferably have a high electromechanical coupling factor, a high Curie point, low dielectric loss at high drive and stable properties over time and temperature. Typical PZT materials suitable for such applications are PZT-4 or PZT-8 available from Morgan Technical Ceramics, or equivalent. The metalized ceramic elements 28 and 29 are stacked with the polarization directions anti-parallel, with a thin metal disc electrode 33 in between, so that they may be connected electrically in parallel while remaining mechanically in series. In an exemplary embodiment, the ceramic elements 28 and 29 are metalized on both flat faces to provide uniform electrical contact to the metal electrodes 32, 33 and the metal tail mass 31.

The purpose of the stress bolt 30 is to apply a compressive load to the ceramic ring stack so that the ceramic elements avoid experiencing undue tensile stress during high-power operation: ceramics have low tensile strength and can shatter under tensile stress. The pre-stress of the bolt may be set using a torque wrench.

The radiating head mass 22 is made of a light metal such as, in this example, aluminum. In this exemplary embodiment, the radiating head mass 22 is an integral part of the front cover 12, and thereby made of the same material. The front cover 12 and radiating head mass 22 may be covered with protective paint, as is the case with the main housing 11.

The heavier tail mass 31 of assembly 20 is made of a heavy metal, in this example, stainless steel. Other candidate materials for the tail mass are brass or tungsten.

The tester 10 operates in the following manner. On pressing the touch switch 24, the electronic drive circuit 27 sends a series of high voltage pulses to the electrodes 32 and 33 of the ultrasonic emitting assembly 20. The poled piezoelectric ceramic elements 28 and 29 respond to the electric field with a dimensional change. This mechanical energy is transmitted to the head mass 22 which then emits the energy as ultrasonic pressure waves. The entire mechanical assembly of tail mass 31, ceramic piezoelectric elements 28 and 29, stress bolt 30 and head mass 22 acts as a resonator with a typical frequency of 30 kHz in an exemplary embodiment. This resonator frequency is in the frequency range (20 kHz to 100 kHz) of ultrasonic gas leak detectors described below. The resonance frequency can be changed from 30 kHz to higher or lower frequencies by changing the mass and size of the mechanical elements of the transducer assembly 20. Frequencies in the audio range (below 15 kHz) may also be obtained if an audio frequency sound source is desired. On powering the circuit 27 via the piezo touch switch 24, the circuit 27 finds the electrical resonance frequency and locks on to the resonance frequency. In an exemplary embodiment, changes in resonant frequency, e.g. with temperature, are tracked by the circuit 27 which locks on to the resonant frequency regardless of small changes over time and temperature variations.

Figure 4A:
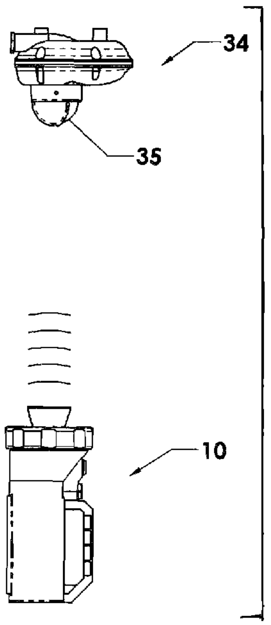
FIG. 4A illustrates an exemplary setup showing how a system as shown in FIGS. 1-3 may be used to test the system functionality and alarms of an ultrasonic gas detector along the axis of the gas detector.

One exemplary application for an acoustic source as described herein is as a tester to remotely trigger the operation and alarm levels of an ultrasonic gas leak detector. FIG. 4A illustrates a setup (not to scale) showing how the system 10 may be used to test the system functionality and alarms of an ultrasonic gas leak detector, such as, for example, one of the model MM0100, Surveyor, Observer or Observer-H detectors manufactured by Gassonic A/S of Denmark, a General Monitors company, along the axis of the gas detector. The ultrasonic gas leak detector 34 in this example includes an ultrasonic sensing microphone 35, and is typically mounted with the ultrasound sensing microphone 35 facing downwardly. An operator standing below and at some distance, typically 5 meters away, can activate the system 10 and test the functionality and alarms of the ultrasonic gas leak detector 34. In one exemplary embodiment, the sound pressure level generated by the system 10 at a distance of 5 meters is typically 95 dB. As the alarm level for the ultrasonic gas leak detector is typically set at a maximum of 84 dB (for high background noise environments), the system 10 is able to conveniently test system functionality and alarms without the need for release of pressurized inert gas.

Figure 4B:
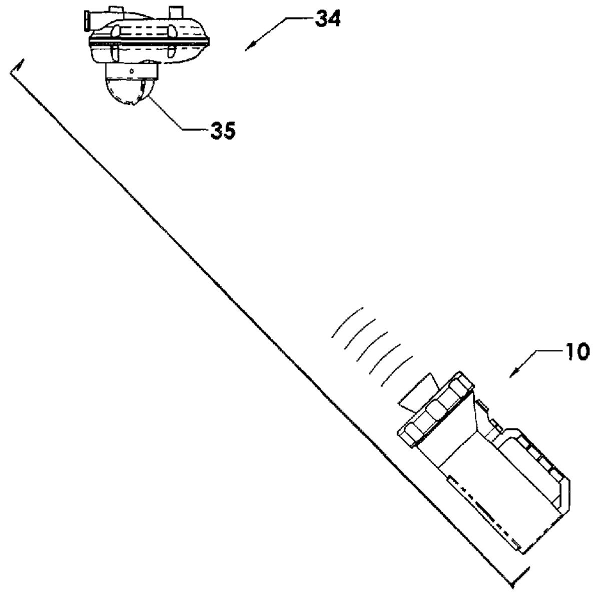
FIG. 4B illustrates another exemplary setup showing how a system as illustrated in FIGS. 1-3 may be used to test the system functionality and alarms of an ultrasonic gas detector at an angle to the axis of the gas detector.

FIG. 4B illustrates another setup (not to scale) showing how an exemplary embodiment of a system 10 may be used to test the system functionality and alarms of an ultrasonic gas leak detector at an angle to the axis of the gas detector 34. As the area of coverage of the ultrasonic gas leak detector in this example is conical shaped and pointing down, such testing at various angles to the microphone axis ensures the full functionality of the ultrasonic gas leak detector over its entire area of coverage. The detector 34 is typically mounted three to five meters high above ground level. An operator can thus walk under the ultrasonic gas leak detector and test system functionality and alarms with convenience at different distances and angles.

Referring again to FIG. 1, in this exemplary embodiment, the head mass 22 is an integral part of the front cover 12, machined or cast in one piece. The front cover 12 is attached to the main housing 11 via special threads 36. The threads 36 are selected with the appropriate form, pitch, and length (number of threads) so as to meet the agency requirements for an explosion proof or flameproof design. For the threads between the main housing 11 and the front cover 12 the threads could be 4½-16 UN-2A/2B×0.315 inches long, which results in 5 full threads engaged. The piezo touch switch 24 may be supported on a threaded hollow plug or casing, which threads into corresponding threads formed in an opening in the main housing 11. The hollow plug may be filled with an encapsulant. For the threads between the main housing 11 and the piezo touch switch 24 the threads could be M20×1×0.96 inches, which results in 24 full threads engaged.

In an exemplary embodiment, the wall thickness of the housing structure for the entire system 10 is also selected so as to withstand the tests required for an explosion proof or flameproof design. These tests include withstanding a certain hydrostatic pressure without permanent distortion of the flamepaths, and the ignition of a calculated amount of an explosive gas such as 38% hydrogen in air within the enclosure 10 without causing a rupture. Examples of such tests and test criteria are described in documents CSA C22.2 No. 30-M1986 from the Canadian Standards Association and IEC 60079-1 from the International Electrotechnical Commission. The threads and construction of the illuminated touch switch 24 and the plug 25 are also designed to meet the requirements of such agency standards.

A unique feature of an exemplary embodiment of the system 10 is that the ultrasonic energy is emitted from the solid face of the flared head mass 22 after propagating through the bulk of the metal of the head mass 22. The directional ultrasonic energy (FIG. 7) is therefore emitted from an explosion proof or flameproof enclosure 10 that is fully enclosed and protected from the potentially harsh external environment.

Referring to FIG. 3, the outside rim 37 of the front cover 12 in this exemplary embodiment has flats to enable a tool or human hand to hold the front cover 12 and tighten it onto the main housing 11 so that the threads 36 are fully engaged.

Figure 5:
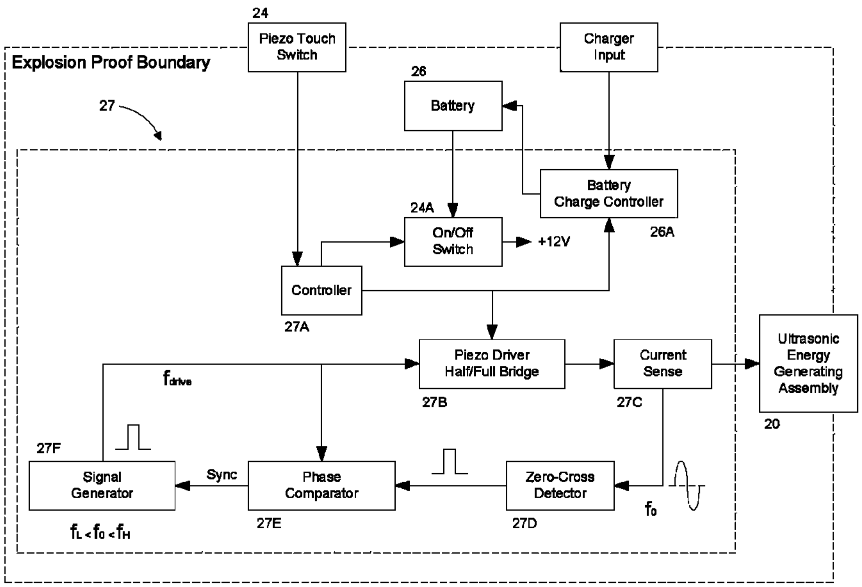
FIG. 5 shows a simplified schematic block diagram of an exemplary embodiment of an electronic circuit used to electrically drive the acoustic transducer of a system as illustrated in FIGS. 1-3 at its mechanical resonance frequency.

FIG. 5 shows a block diagram of an exemplary embodiment of an electronic drive circuit 27 used to electrically drive the ultrasonic emitting assembly 20 at its mechanical resonance frequency. On pressing the piezo touch switch 24, the electrical On/Off switch 24A inside enclosure 11 is turned on and the battery 26 powers on the electronic drive circuit 27. Signal Generator 27F generates a drive signal $f_{drive}$, whose frequency is set by design at a value within a small range (~1 kHz) of the resonant frequency $f_0$ of the transducer. The ultrasonic emitting assembly 20 starts vibrating, forcing the Signal Generator 27F, through the Current Sense 27C, Zero-Cross Detector 27D and the Phase Comparator 27E circuitry, to adjust the drive signal frequency $f_{drive}$ towards minimizing the phase difference between $f_{drive}$ and the feedback signal $f_0$ until the driving signal is locked on the resonance frequency of the transducer, i.e. $f_{drive}=f_0$. Any drift in the resonance frequency of the transducer, for example due to temperature, will be followed by the driving signal keeping the transducer vibration amplitude at the peak value. The controller 27A takes care of housekeeping tasks such as monitoring and controlling the On/Off switch 24A, LED status lights on the piezo touch switch 24, the battery charge controller 26A and the piezo driver circuit 27B.

Figure 6:
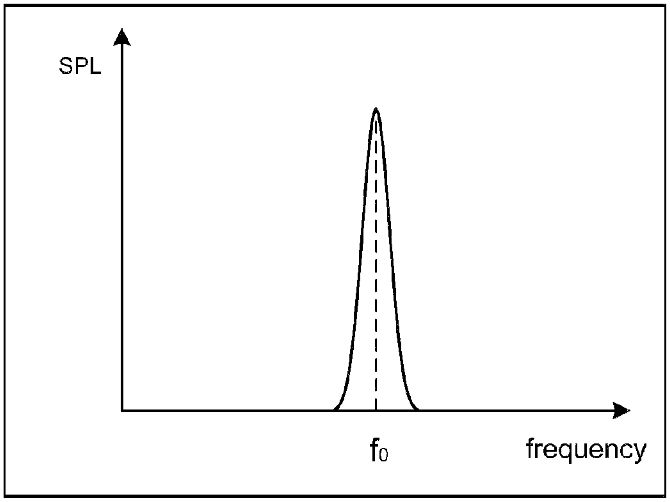
FIG. 6 shows a typical exemplary frequency response of the emitted ultrasonic sound pressure obtained with an exemplary embodiment of a transducer of a system as illustrated in FIGS. 1-3 and 5.

The ultrasonic emitting assembly 20 may have a small resonance frequency shift of a few hundred Hertz measured over a wide temperature change of 80° C. (e.g. from −20° C. to +60° C.). FIG. 6 illustrates an exemplary sound pressure level (SPL) generated by an exemplary embodiment of the system 10 and as would be measured with a calibrated ultrasonic microphone. The full width at half maximum (FWHM) at 6 dB below the peak SPL for this example is about 200 Hz, which implies a relatively high quality factor Q of 150 for the resonance. The quality factor Q is a figure of merit for resonators and describes how sharp a resonance is via the ratio of the peak frequency to the full width at half maximum (FWHM), An exemplary embodiment of the system 10 draws about 10 Watts of electrical power, which is efficiently converted into the large SPL of greater than 95 dB measured at 5 meters distance. The estimated life of the battery for a transducer left running is several hours: in actuality the tester is turned on by the user for only a minute or two to trigger the alarms of the ultrasonic gas leak detector (as shown in FIG. 4A and FIG. 4B). Pressing the piezo touch switch 24 a second time switches the system 10 off. The electronic circuit can also be designed with a time out so that the system turns off after a predetermined time interval. This feature prevents the system 10 from being left on unattended and causing a drain on the battery 26, and reduces the possibility of unknowingly exposing nearby humans and equipment to ultrasonic energy.

Additional piezoceramic ring pairs, with polarization directions anti-parallel, can be added to the transducer stack 20 to boost the ultrasonic energy generated, though one pair of rings have shown to be sufficient to operate the source as an acoustic tester at several meters distance from an ultrasonic gas leak detector. The transducer typically also has higher frequency modes of vibration; the electronic scheme of FIG. 5 locks onto the desired resonance frequency of FIG. 6 and prevents the other modes of vibration from being excited.

Figure 7:
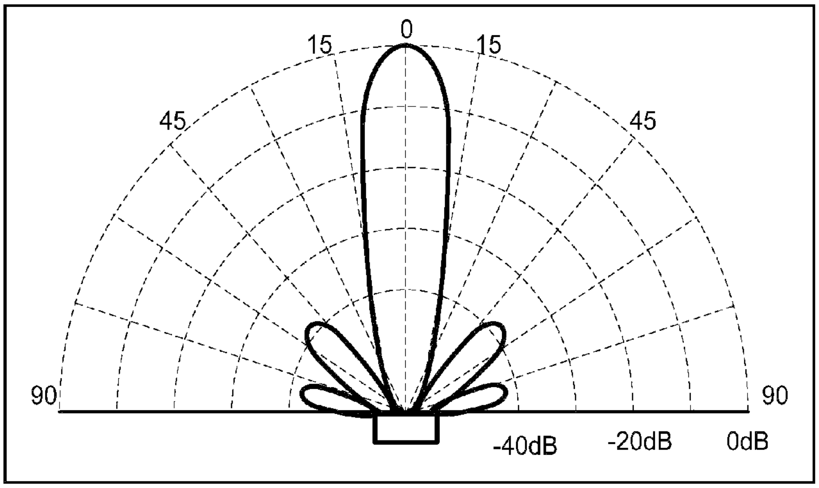
FIG. 7 shows a typical exemplary directivity of the emitted ultrasonic sound pressure produced by a transducer of a system as illustrated in FIGS. 1-3 and 5.

FIG. 7 shows the directionality of the ultrasonic beam generated by the exemplary tester 10. In this embodiment, most of the ultrasonic energy is concentrated within the main lobe of half angle 15 degrees. This provides for both the high concentration of ultrasonic energy in the forward direction, yet provides for a wide enough angle of emission, so that extremely accurate and inconvenient pointing or alignment is not required to test an ultrasonic gas leak detector from several meters distance with a portable tester.

Exemplary embodiments of an acoustic source may provide one or more of the following features:

(1) A directional beam of intense airborne ultrasonic energy;

(2) An explosion proof or flameproof enclosure for the ultrasonic source by making the transducer an integral part of the enclosure;

(3) Provide a man-portable device for generating airborne, directional ultrasonic energy;

(4) A closed loop method of tracking the mechanical vibration resonance frequency of the transducer and control the driving signal of the transducer in order to acquire and maintain the mechanical (vibration) resonance.

It is understood that the above described embodiments are merely illustrative of the possible specific embodiments that may represent principles of the present invention. Other arrangements may readily be devised in accordance with these principles by those skilled in the art without departing from the scope and spirit of the invention.

What is claimed is:

1. An explosion-proof system for generating airborne acoustic energy, comprising:

a main housing including an open housing space and an opening;

a cover structure configured for removable attachment to the main housing structure to cover the opening and provide an explosion-proof housing structure, the cover structure including an integral head mass having a front face, the cover structure and head mass forming a one-piece unitary structure having an inside surface and an outside surface from which the head mass protrudes, the explosion-proof housing structure configured to contain any explosive condition within the housing structure and prevent such condition from igniting an environment surrounding the housing structure;

an acoustic energy generating assembly including a tail mass, an excitation assembly, and said head mass, said tail mass and said excitation assembly attached to the inside surface of the cover structure and configured to be disposed within said explosion-proof housing structure with the cover structure attached to the main housing, the head mass disposed outside the explosion-proof housing structure;

a power source disposed within said explosion-proof housing structure;

an electronic circuit disposed within said explosion-proof housing structure powered by the power source and electrically coupled to the excitation assembly, the electronic circuit configured to generate a drive signal for driving the excitation assembly to cause the acoustic energy emitting assembly to resonate and generate airborne acoustic energy from said front face of the integral head mass;

the cover structure and the front face further characterized as being uninterrupted by any openings; and wherein the power source is a rechargeable battery, and the main housing includes a battery charging port for electrical connection to a battery charger in a charging mode, the battery charging port revealed by removal of a threaded plug which seals the port.

2. The system of claim 1, wherein said system is man-portable.

3. The system of claim 1, further comprising a switch on said main housing structure and connected to the electronic circuit to activate operation of the system.

4. The system of claim 1, wherein said excitation assembly includes a piezoelectric assembly.

5. The system of claim 1, wherein the electronic drive circuit includes a feedback circuit configured to track a mechanical vibration frequency of the acoustic energy emitting assembly and to control the drive signal to acquire and maintain a drive signal frequency at or within a small range of the mechanical resonance frequency of the acoustic energy generating assembly as the mechanical resonance frequency changes over temperature variations.

6. The system of claim 1, wherein the acoustic energy generating assembly is configured to provide a directional beam of ultrasonic energy.

7. The system of claim 6, wherein said directional beam provides a high sound pressure level (SPL) of at least 95 dB at several meters distance from the system.

8. The system of claim 1, in which the excitation assembly includes a plurality of piezoelectric rings sandwiched between the head mass and the tail mass and assembled together by a stress bolt passing through the tail mass, the plurality of piezoelectric rings and through the inside surface of the cover structure and into a threaded bore formed in the head mass.

9. The system of claim 8, in which the plurality of piezoelectric rings include first and second longitudinally poled piezoelectric ceramic lead zirconate titanate (PZT) rings.

10. The system of claim 1, wherein the cover structure is configured for attachment to the main housing by engagement of threads selected with an appropriate form, pitch, and number of threads to meet governmental requirements for an explosion proof or flameproof design.

11. The system of claim 1, wherein the acoustic energy generating assembly is configured to generate ultrasonic acoustic energy.

12. The system of claim 1, wherein:

the opening of the main housing has a circular configuration and is provided with a housing set of threads;

the cover structure comprising an outer rim portion defining a cover opening and provided with a cover set of threads, the cover set of threads configured to cooperatively engage the housing set of threads to attach the cover structure to the main housing;

the cover structure further including a plate portion closing one end of the outer rim portion and defining the inside surface and the outside surface.

13. The system of claim 1, wherein said first metal is aluminum, and said second metal is selected from the group consisting of stainless steel, brass and tungsten.

14. The system of claim 1, wherein the head mass is a flared mass protruding from the outside surface of the cover structure and said front face is a solid face spaced from a rim portion of the cover structure.

15. A method for remotely testing an ultrasonic gas leak detector, comprising:

generating an intense beam of ultrasonic energy using the system of claim 6;

directing said beam of ultrasonic energy at the ultrasonic gas leak detector;

moving the system of claim 6 to direct said beam of ultrasonic energy at different distances and angles relative to the ultrasonic gas leak detector; and monitoring the operation of the detector for proper operation during the test.

16. An explosion-proof system for generating airborne acoustic energy, comprising:

a main housing including an open housing space and an opening;

a cover structure configured for removable attachment to the main housing to cover the opening and provide an explosion-proof housing structure, the cover structure including an integral head mass having a front face, the cover structure and head mass forming a one-piece unitary structure having an inside surface and an outside surface from which the head mass protrudes, the explosion-proof housing structure configured to contain any explosive condition within the housing structure and prevent such condition from igniting an environment surrounding the housing structure;

a Tonpilz acoustic transducer including a tail mass, a piezoelectric excitation assembly, and said head mass, said tail mass and said piezoelectric excitation assembly attached to the inside surface of the cover structure and configured to be disposed within said explosion-proof housing structure with the cover structure attached to the main housing, the head mass disposed outside the explosion-proof housing structure, with the piezoelectric excitation assembly sandwiched between the head mass and the tail mass by a stress bolt;

a power source disposed within said explosion-proof housing structure;

an electronic circuit disposed within said explosion-proof housing structure powered by the power source and electrically coupled to the piezoelectric excitation assembly, the electronic circuit configured to generate a drive signal for driving the piezoelectric excitation assembly to cause the Tonpilz transducer to resonate and generate airborne acoustic energy from the front face of the integral head mass;

the outside surface of the cover structure further characterized as being uninterrupted by any openings; and wherein the cover structure and head mass are formed of a first, lightweight metal, and the tail mass is fabricated of a second metal different from the first metal, and wherein the second metal is heavier than the first metal; and wherein the power source is a rechargeable battery, and the main housing includes a battery charging port for electrical connection to a battery charger in a charging mode, the battery charging port revealed by removal of a threaded plug which seals the port.

17. The system of claim 16, wherein said system is man-portable.

18. The system of claim 16, wherein the acoustic energy emitting assembly and the electronic circuit are configured to provide a directional beam of energy in the audible range.

19. The system of claim 16, further comprising a switch on said main housing structure and connected to the electronic circuit to activate operation of the system.

20. The system of claim 16, wherein the electronic drive circuit includes a feedback circuit configured to track a mechanical vibration frequency of the acoustic energy emitting assembly and to control the drive signal to acquire and maintain a drive signal frequency at or within a small range of the mechanical resonance frequency of the acoustic energy generating assembly as the mechanical resonance frequency changes over temperature variations.

21. The system of claim 16, wherein the acoustic energy emitting assembly is configured to provide a directional beam of ultrasonic energy.

22. The system of claim 21, wherein said directional beam provides a high sound pressure level (SPL) of at least 95 dB at several meters distance from the system.

23. The system of claim 16, wherein:

the opening of the main housing has a circular configuration and is provided with a housing set of threads;

the cover structure comprising an outer rim portion defining a cover opening and provided with a cover set of threads, the cover set of threads configured to cooperatively engage the housing set of threads to attach the cover structure to the main housing;

the cover structure further including a plate portion closing one end of the outer rim portion and defining the inside surface and the outside surface.

24. The system of claim 16, wherein said first metal is aluminum, and said second metal is selected from the group consisting of stainless steel, brass and tungsten.

25. The system of claim 16, wherein the head mass is a flared mass protruding from the outside surface of the cover structure and said front face is a solid face spaced from a rim portion of the cover structure.

26. A method for remotely testing an ultrasonic gas leak detector, comprising:

generating an intense beam of ultrasonic energy using the system of claim 16;

directing said beam of ultrasonic energy at the ultrasonic gas leak detector;

monitoring the operation of the detector for proper operation during the test.

27. The method of claim 26, wherein the system is man-portable, the method further comprising:

moving the system in relation to the gas leak detector to test detector functionality at different system distances and angles from the detector.

* * * * *